(12) United States Patent
Corbeil, Jr. et al.

(10) Patent No.: US 7,185,298 B2
(45) Date of Patent: Feb. 27, 2007

(54) METHOD OF PARASITIC EXTRACTION FROM A PREVIOUSLY CALCULATED CAPACITANCE SOLUTION

(75) Inventors: John D. Corbeil, Jr., Ft. Collins, CO (US); Daniel W. Prevedel, Ft. Collins, CO (US); Robert W. Davis, Ft. Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 265 days.

(21) Appl. No.: 11/015,114

(22) Filed: Dec. 17, 2004

(65) Prior Publication Data

US 2006/0136850 A1    Jun. 22, 2006

(51) Int. Cl.
*G06F 17/50* (2006.01)

(52) U.S. Cl. .................................. 716/5; 716/4; 716/6

(58) Field of Classification Search ................. 716/4–6
See application file for complete search history.

(56) References Cited

U.S. PATENT DOCUMENTS

| | | | |
|---|---|---|---|
| 5,515,291 A * | 5/1996 | Omori et al. ................... | 716/6 |
| 5,880,967 A * | 3/1999 | Jyu et al. ........................ | 716/6 |
| 6,057,171 A * | 5/2000 | Chou et al. .................... | 438/15 |
| 6,243,653 B1 * | 6/2001 | Findley ......................... | 702/65 |
| 6,463,571 B1 | 10/2002 | Morgan | |
| 6,530,073 B2 | 3/2003 | Morgan | |
| 6,789,248 B1 * | 9/2004 | Lu et al. ......................... | 716/18 |
| 6,880,142 B2 * | 4/2005 | Cui et al. ....................... | 716/6 |
| 7,001,823 B1 * | 2/2006 | Gopinath et al. ........... | 438/424 |

* cited by examiner

*Primary Examiner*—Vuthe Siek
*Assistant Examiner*—Naum Levin
(74) *Attorney, Agent, or Firm*—Eric James Whitesell

(57) ABSTRACT

A method and computer program product for parasitic extraction from a previously calculated capacitance solution include steps of: (a) receiving as input a design database for an integrated circuit design; (b) receiving as input a first set of operating conditions and a second set of operating conditions for the integrated circuit design; (c) calculating a first resistance solution and a single capacitance solution from the design database and the first set of operating conditions; (d) performing a parasitic extraction of the first resistance solution and the single capacitance solution to generate a first set of parasitic values; (e) calculating a second resistance solution from the design database and the second set of operating conditions; (f) performing a parasitic extraction of the second resistance solution and the single capacitance solution to generate a second set of parasitic values; and (g) generating as output the first set of parasitic values and the second set of parasitic values.

6 Claims, 5 Drawing Sheets

METHOD OF PARASITIC EXTRACTION FROM A PREVIOUSLY CALCULATED CAPACITANCE SOLUTION

BACKGROUND OF THE INVENTION

1. Field of the Invention

The method of parasitic extraction of an integrated circuit design for multiple operating conditions disclosed herein is directed to the design and verification of integrated circuits. More specifically, but without limitation thereto, this method is directed to simulating the effects of resistance and capacitance in an integrated circuit design under different operating conditions.

2. Description of Related Art

A step frequently performed in the design of integrated circuits is called parasitic extraction, in which the resistance and capacitance of logic gates and interconnect wires is simulated in a computer model to determine the timing performance of the integrated circuit design.

SUMMARY OF THE INVENTION

In exemplary embodiments, a method and computer program product for parasitic extraction from a previously calculated capacitance solution include steps of:

(a) receiving as input a design database for an integrated circuit design;

(b) receiving as input a first set of operating conditions and a second set of operating conditions for the integrated circuit design;

(c) calculating a first resistance solution and a single capacitance solution from the design database and the first set of operating conditions;

(d) performing a parasitic extraction of the first resistance solution and the single capacitance solution to generate a first set of parasitic values;

(e) calculating a second resistance solution from the design database and the second set of operating conditions;

(f) performing a parasitic extraction of the second resistance solution and the single capacitance solution to generate a second set of parasitic values; and (g) generating as output the first set of parasitic values and the second set of parasitic values.

BRIEF DESCRIPTION OF THE DRAWINGS

The embodiments described herein are illustrated by way of example and not limitation in the accompanying figures, in which like references indicate similar elements throughout the several views of the drawings, and in which.

Elements in the figures are illustrated for simplicity and clarity and have not necessarily been drawn to scale. For example, the dimensions of some elements in the figures may be exaggerated relative to other elements to point out distinctive features in the illustrated embodiments.

DESCRIPTION OF THE ILLUSTRATED EMBODIMENTS

In some applications, it is desirable to perform a parasitic extraction for an integrated circuit design to simulate the effects of resistance and capacitance on the timing performance of the design under more than one set of operating conditions. For example, when a circuit building block, typically called a hard macro, or "hardmac", is instantiated in an integrated circuit design, coupling effects between chip level interconnects routed over the hardmac or other closely adjacent metal and the hardmac may cause the chip to malfunction. These coupling effects are commonly called parasitics.

Previous methods for performing a parasitic extraction for different operating conditions require repeating the entire parasitic extraction, even for parameters that remain unchanged. For example, if the temperature is changed to define a new operating condition, then the interconnect resistance has to be extracted again. However, to extract the resistance under the new operating condition, the entire parasitic extraction for capacitance and resistance is repeated, even though the capacitance solution remains unchanged from the previous extraction.

Figure 1:
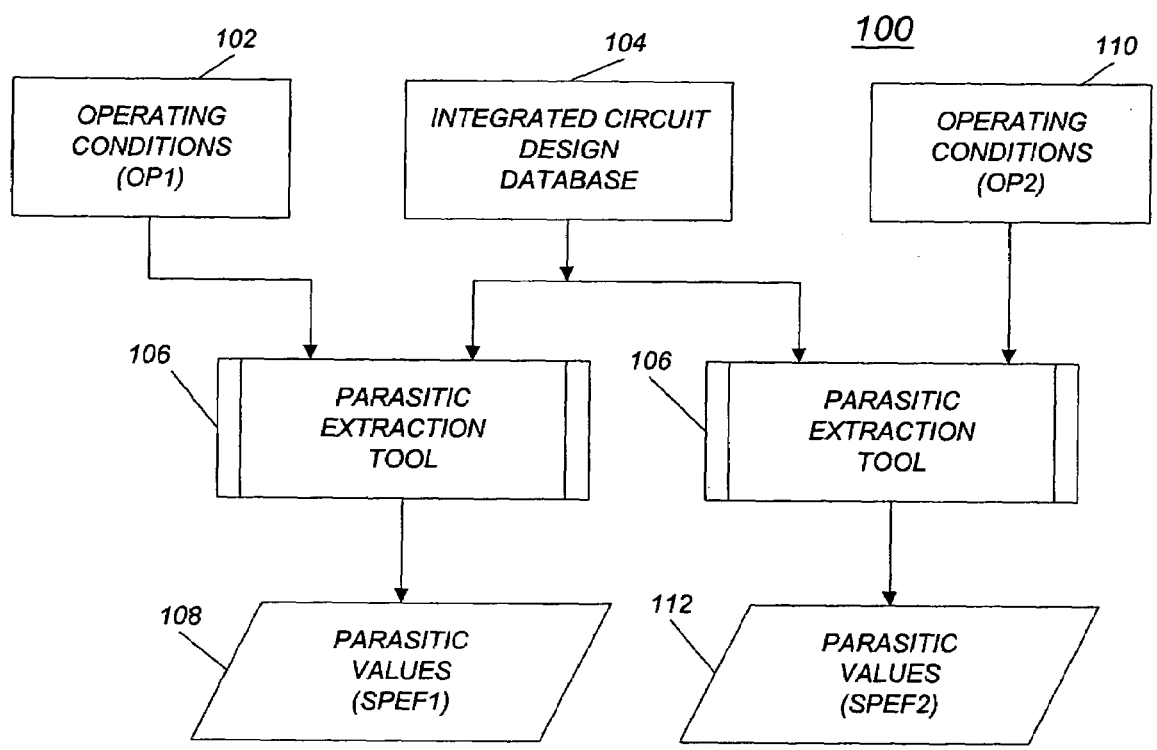
FIG. 1 illustrates a flow diagram of a typical parasitic extraction performed for multiple operating conditions according to the prior art.

FIG. 1 illustrates a flow diagram 100 of a typical parasitic extraction performed for multiple operating conditions according to the prior art. Shown in FIG. 1 are a first set of operating conditions 102, a design database 104, a parasitic extraction tool 106, a first standard parasitic extraction format (SPEF) file 108, a second set of operating conditions 110, and a second standard parasitic extraction format file 112.

In FIG. 1, the design database 104 of the integrated circuit design is received as input. The design database may be, for example, a computer data file in a standard format such as GDSII, LEF and DEF that includes the circuit elements from which the values of interconnect resistance and capacitance of the chip design may be calculated. The first set of operating conditions 102 and the second set of operating conditions 110 include values for parameters such as the operating temperature and supply voltage. The parasitic extraction tool 106 receives the design database 104, calculates the interconnect resistance and capacitance of the chip design for the first set of operating conditions 102, and extracts the parasitic values for the first set of operating conditions 102 as output in the first standard parasitic extraction format file 108. An example of a standard parasitic extraction tool is described by Morgan, U.S. Pat. No. 6,463,571 B1, incorporated herein by reference.

A disadvantage of the method of FIG. 1 is that both the resistance solution and the capacitance solution for the integrated circuit design are calculated for each set of operating conditions, even though the capacitance solution does not change. The unnecessary repetition of the capacitance solution results in increased turnaround time and resource consumption. A method that overcomes this disadvantage is described as follows.

In one embodiment, a method of parasitic extraction from a previously calculated capacitance solution includes steps of:

(a) receiving as input a design database for an integrated circuit design;
(b) receiving as input a first set of operating conditions and a second set of operating conditions for the integrated circuit design;
(c) calculating a first resistance solution and a single capacitance solution from the design database and the first set of operating conditions;
(d) performing a parasitic extraction of the first resistance solution and the single capacitance solution to generate a first set of parasitic values;
(e) calculating a second resistance solution from the design database and the second set of operating conditions;
(f) performing a parasitic extraction of the second resistance solution and the single capacitance solution to generate a second set of parasitic values; and
(g) generating as output the first set of parasitic values and the second set of parasitic values.

Figure 2:
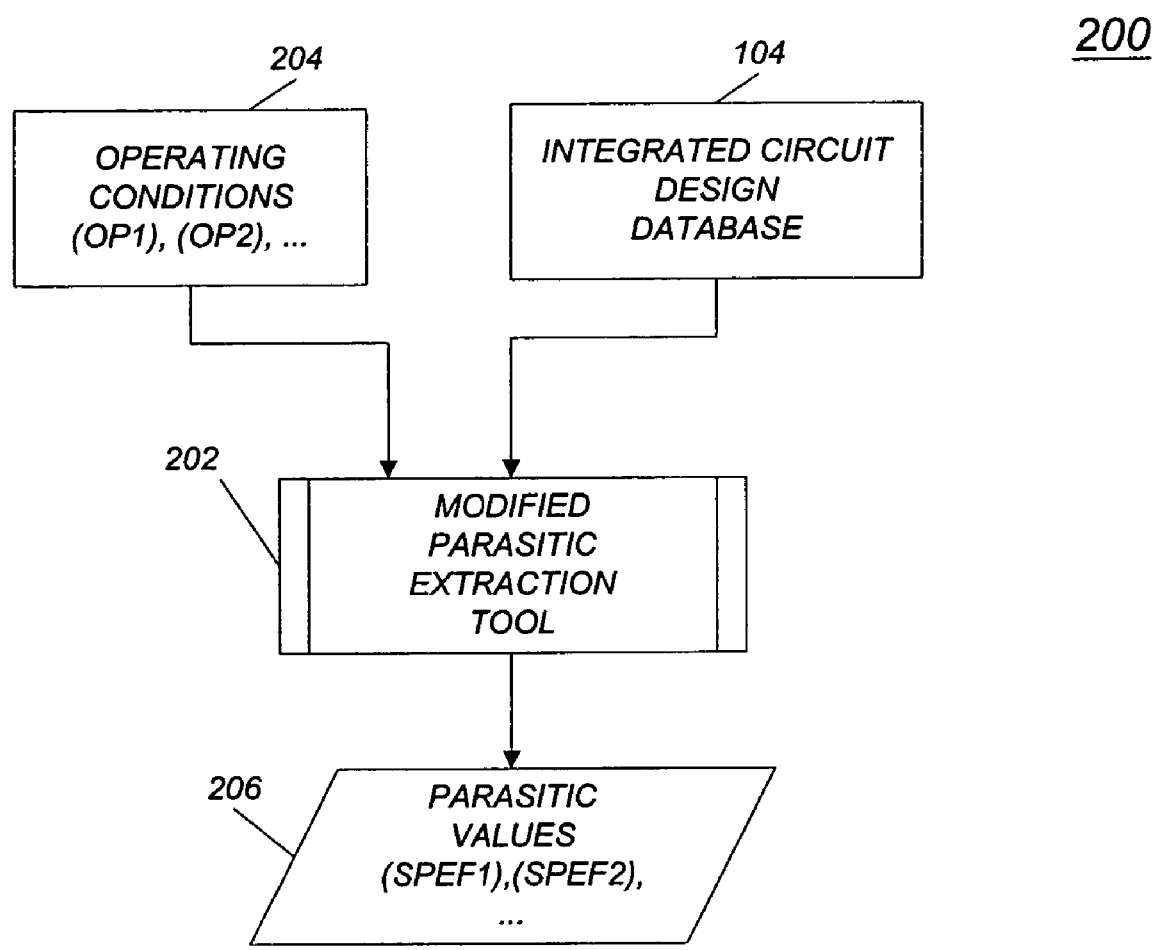
FIG. 2 illustrates a flow diagram of a parasitic extraction performed for multiple operating conditions that uses a single capacitance solution.

FIG. 2 illustrates a flow diagram 200 of a parasitic extraction performed for multiple operating conditions that uses a single capacitance solution. Shown in FIG. 2 are a design database 104, a modified parasitic extraction tool 202, multiple sets of operating conditions 204, and multiple standard parasitic extraction format files 206.

In FIG. 2, the design database 104 of the integrated circuit design is received as input in the same manner as in FIG. 1. The modified parasitic extraction tool 202 also receives design database 104 and calculates the interconnect resistance and capacitance of the chip design for the first set of operating conditions from the multiple sets of operating conditions 204 in the same manner as in FIG. 1. However, the modified parasitic extraction tool 202 saves the capacitance solution so that the same capacitance solution may be used to calculate the parasitic values from the resistance solution calculated for each subsequent set of operating conditions in the multiple sets of operating conditions 204. The modification to save the capacitance solution and to use the same capacitance solution for each subsequent set of operating conditions may be made to the parasitic extraction tool 106 in FIG. 1, for example, according to well known computer programming techniques.

The modified parasitic extraction tool 202 calculates the resistance solution for each subsequent set of operating conditions in the multiple sets of operating conditions 204 in the same manner as in FIG. 1, however, the parasitic values for each subsequent set of operating conditions are calculated using the same capacitance solution calculated for the first set of operating conditions, thereby advantageously avoiding the additional run time and associated costs of recalculating the capacitance solution for each set of operating conditions. The parasitic values are generated as output in the multiple standard parasitic extraction format (SPEF) files 206, for example, in the same manner as used to generate the standard parasitic extraction format files 108 and 112 in FIG. 1.

Using the method of FIG. 2, the time savings in performing the parasitic extraction may be used, for example, to calculate parasitic values for a greater number of sets of operating conditions in the same time previously required to calculate parasitic values for a fewer sets of operating conditions. For example, the operating temperature may be varied by increments in each set of operating conditions to plot the effect of operating temperature on performance. Alternatively, the resistance may be scaled automatically from a list of temperatures. Other parameters may also be varied in each set of operating conditions according to well known techniques to practice various embodiments within the scope of the appended claims. For example, there may be process differences or material differences that may affect the parasitic values.

Figure 3:
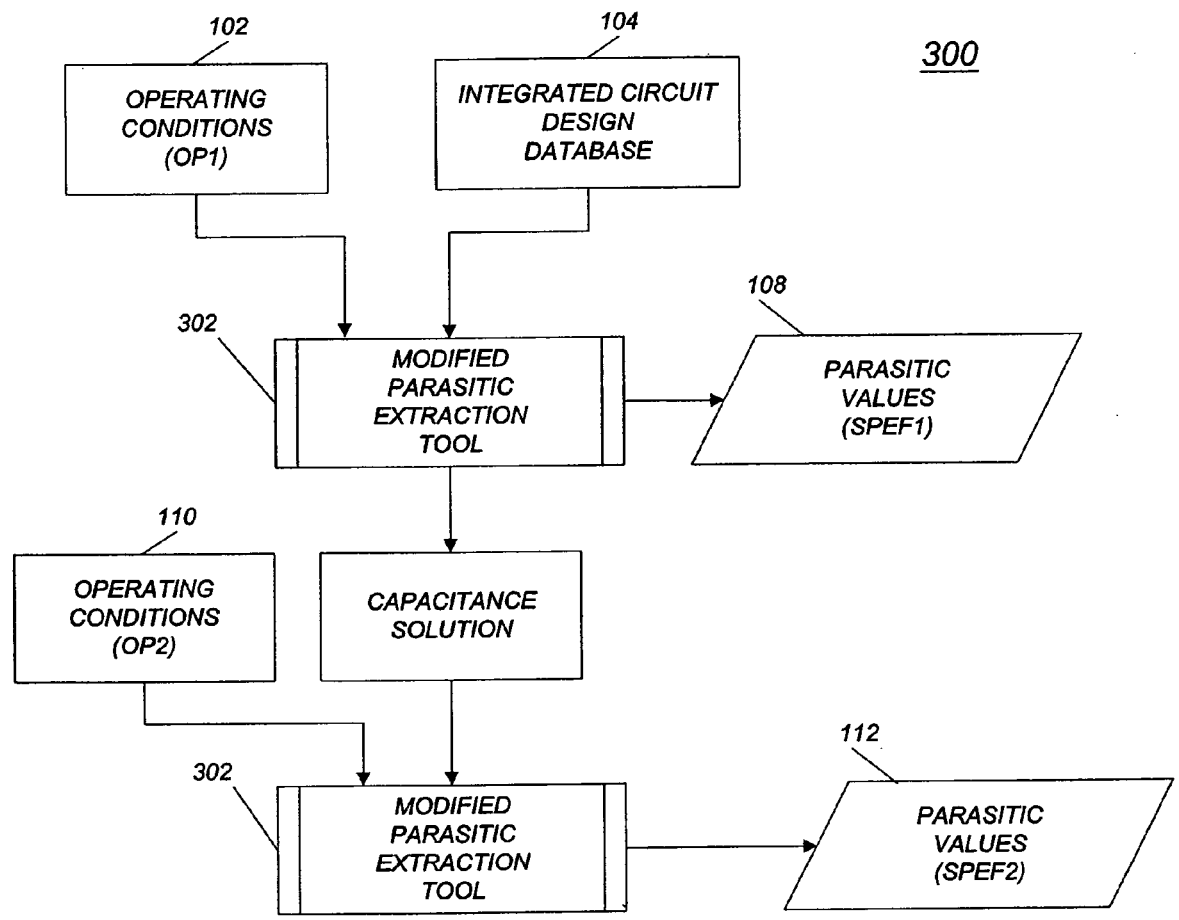
FIG. 3 illustrates a flow diagram of a parasitic extraction performed for successive sets of operating conditions using a single capacitance solution.

FIG. 3 illustrates a flow diagram 300 of a parasitic extraction performed for successive sets of operating conditions using a single capacitance solution. Shown in FIG. 3 are a first set of operating conditions 102, a design database 104, a first standard parasitic extraction format file 108, a second set of operating conditions 110, a second standard parasitic extraction format file 112, a modified parasitic extraction tool 302, and a saved capacitance solution 304.

In FIG. 3, the design database 104 of the integrated circuit design is received as input as in FIG. 1. The modified parasitic extraction tool 302 receives the design database 104, calculates the interconnect resistance solution and the capacitance solution of the chip design for the first set of operating conditions 102, extracts the parasitic values for the first set of operating conditions 102, and generates the parasitic values as output in the first standard parasitic extraction format file 108. In addition, the modified parasitic extraction tool 302 generates the saved capacitance solution 304 as an output for future use.

When the second set of operating conditions 110 has been determined, then the modified parasitic extraction tool 302 calculates the interconnect resistance solution for the second set of operating conditions 110 and generates the parasitic values as output in the second standard parasitic extraction format file 112. Additional parasitic values for successive sets of operating conditions may be generated using the saved capacitance solution 304 in the same manner used for the second set of operating conditions 110.

Figure 4:
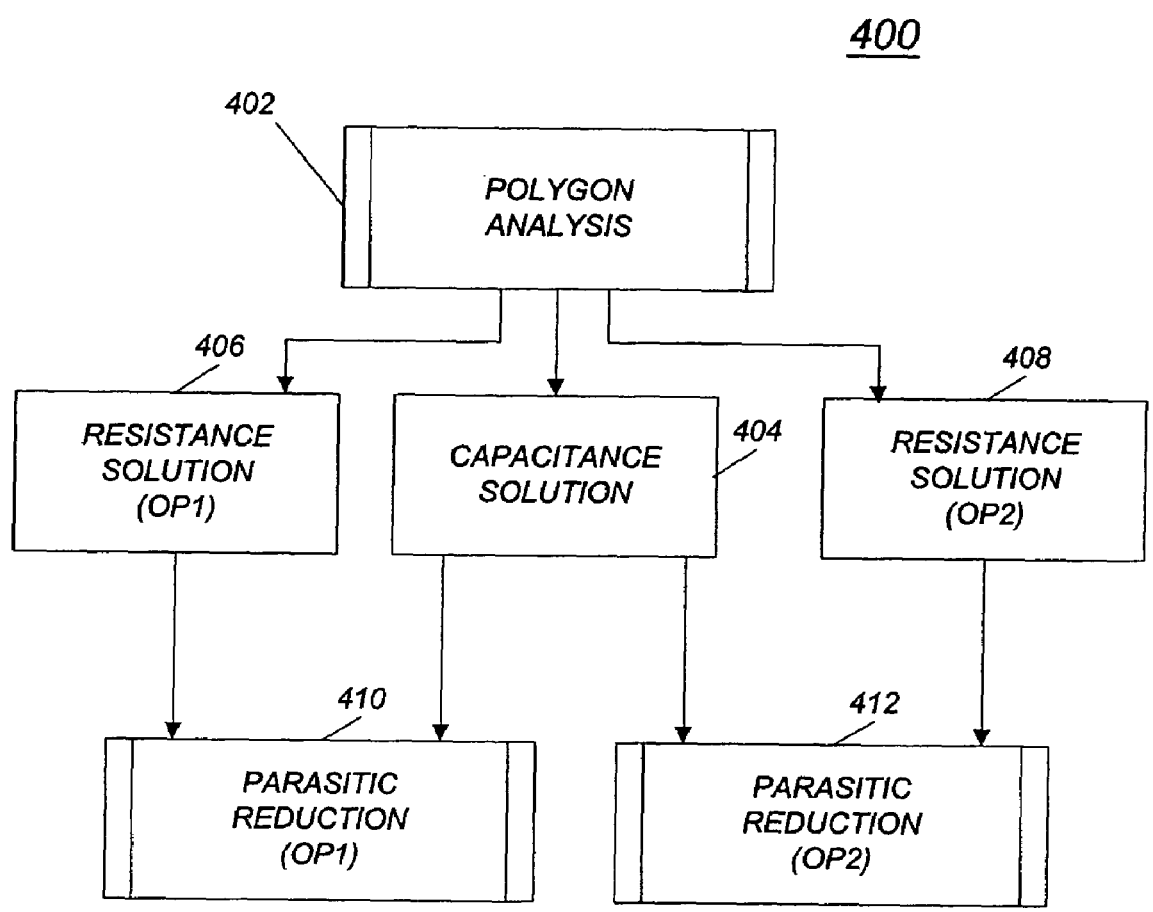
FIG. 4 illustrates a detailed flow diagram of a modified parasitic extraction for FIG. 2.

FIG. 4 illustrates a detailed flow diagram 400 of a modified parasitic extraction for FIG. 2. Shown in FIG. 4 are a polygon analysis module 402, a capacitance solution 404, resistance solutions 406 and 408, and parasitic reduction calculations 410 and 412.

In FIG. 4, the polygon analysis module 402 performs an analysis of the chip layout structures, for example, using the "library" or the "full wave" or "full field" method. In the library method, each circuit element structure in the chip layout is compared to a library of pre-characterized structures so that the parasitic values for the circuit element structure may be interpolated from that of the closest matching structure in the library. In the full wave or full field method, potential equations are calculated for each point on a grid overlaid on the chip layout. Other numerical methods for performing a parasitic extraction randomly or algorithmically select a subset of points at which the potential equations are calculated.

In the example where only a variation in operating temperature differentiates one set of operating conditions from another, the single capacitance solution 404 and resistance solutions 406 and 408 are calculated. The results may be combined in several ways using the same capacitance solution for each set of operating conditions (OP1), (OP2), etc. For example, the individual resistance and capacitance values may be retained. A reduction algorithm may be used to reduce the number of parasitic elements, for example asymptotic waveform evaluation (AWE). Alternatively, the resistance values may be summed and the capacitance values may be summed to generate a single value for the resistance and a single value for the capacitance. Various techniques may be used in combination with the above to reduce the number or significance of coupling capacitance in the parasitic reduction calculations 410 and 412.

The parasitic values may be generated as output according to well known computer programming techniques in several formats, for example, SPEF, SPF, DSPF, a simple list, or in a proprietary format. Each file includes the reduced resistance and capacitance network for one set of operating conditions. The details of the operating conditions may be specified, for example, in the file headers. Alternatively, a single SPEF file may contain multiple operating conditions and parasitic values expressed as triplets. For example, a capacitance for three different materials may be expressed as:

C1 1.2:1.6:1.72

Optionally, the various resistance and capacitance solutions may be saved on a storage medium such as a disk drive for future analysis runs under different operating conditions.

The method described above may also be implemented by instructions for being performed on a computer. The instructions may be embodied in a disk, a CD-ROM, and other computer readable media according to well known computer programming techniques.

In another embodiment, a computer program product for parasitic extraction from a previously calculated capacitance solution includes a medium for embodying a computer program for input to a computer and a computer program embodied in the medium for causing the computer to perform steps of:
  (a) receiving as input a design database for an integrated circuit design;
  (b) receiving as input a first set of operating conditions and a second set of operating conditions for the integrated circuit design;
  (c) calculating a first resistance solution and a single capacitance solution from the design database and the first set of operating conditions;
  (d) performing a parasitic extraction of the first resistance solution and the single capacitance solution to generate a first set of parasitic values;
  (e) calculating a second resistance solution from the design database and the second set of operating conditions;
  (f) performing a parasitic extraction of the second resistance solution and the single capacitance solution to generate a second set of parasitic values; and
  (g) generating as output the first set of parasitic values and the second set of parasitic values.

Figure 5:
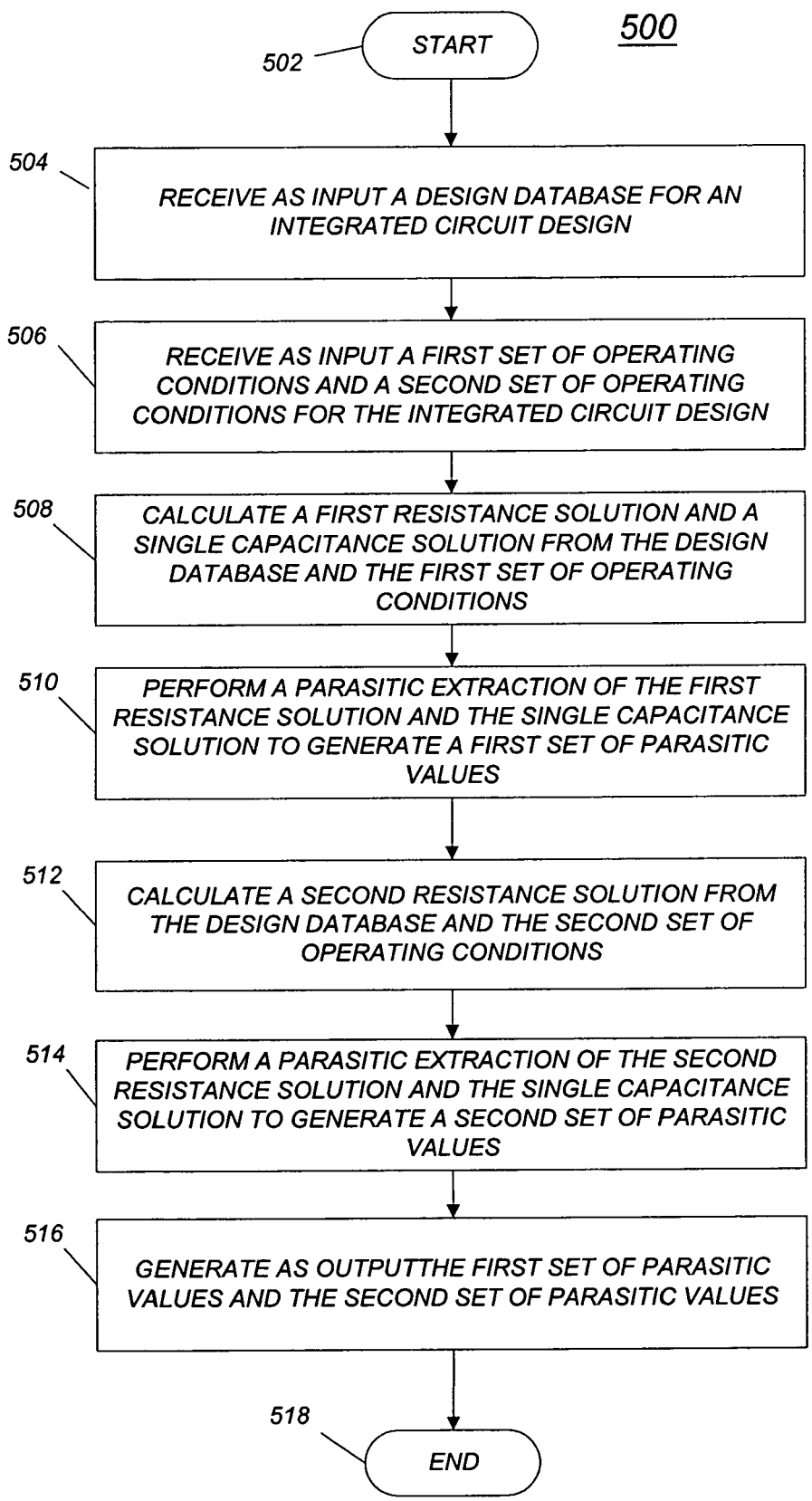
FIG. 5 illustrates a flow chart of a computer program for parasitic extraction from a previously calculated capacitance solution.

FIG. 5 illustrates a flow chart 500 of a computer program for parasitic extraction from a previously calculated capacitance solution.

Step 502 is the entry point of the flow chart 500.

In step 504, a design database for an integrated circuit design is received as input.

In step 506, a first set of operating conditions and a second set of operating conditions for the integrated circuit design are received as input.

In step 508, a first resistance solution and a single capacitance solution is calculated from the design database and the first set of operating conditions according to well known techniques.

In step 510, a parasitic extraction of the first resistance solution and the single capacitance solution is performed according to well known techniques to generate a first set of parasitic values.

In step 512, a second resistance solution is calculated from the design database and the second set of operating conditions in the same manner as in step 508.

In step 514, a parasitic extraction of the second resistance solution and the single capacitance solution is performed in the same manner as in step 510 to generate a second set of parasitic values.

In step 516, the first set of parasitic values and the second set of parasitic values is generated as output in the desired format as described above, for example, as SPEF files.

Step 518 is the exit point of the flow chart 500.

Although the methods illustrated by the flowchart described above and shown with reference to specific steps performed in a specific order, these steps may be combined, sub-divided, or reordered without departing from the scope of the claims. Unless specifically indicated herein, the order and grouping of steps is not a limitation of other embodiments within the scope of the claims.

The specific embodiments and applications thereof described above are for illustrative purposes only and do not preclude modifications and variations that may be made thereto by those skilled in the art within the scope of the following claims.

What is claimed is:

1. A method comprising steps of:
  (a) receiving as input a design database for an integrated circuit design;
  (b) receiving as input a first set of operating conditions and a second set of operating conditions for the integrated circuit design;
  (c) calculating a first resistance solution and a single capacitance solution from the design database and the first set of operating conditions;
  (d) performing a parasitic extraction of the first resistance solution and the single capacitance solution to generate a first set of parasitic values;
  (e) saving the single capacitance solution to calculate a second set of parasitic values from a second resistance solution calculated for the second set of operating conditions;
  (f) calculating the second resistance solution from the design database and the second set of operating conditions;
  (g) performing a parasitic extraction of the second resistance solution and the single capacitance solution to generate the second set of parasitic values; and
  (h) generating as output the first set of parasitic values and the second set of parasitic values.

2. The method of claim 1 wherein the first set of operating conditions and the second set of operating conditions differ in temperature.

3. The method of claim 1 wherein the single capacitance solution is saved for future analysis of the integrated circuit design under different operating conditions.

4. A computer program product comprising:
  a medium for embodying a computer program for input to a computer; and
  a computer program embodied in the medium for causing the computer to perform steps of:
  (a) receiving as input a design database for an integrated circuit design;
  (b) receiving as input a first set of operating conditions and a second set of operating conditions for the integrated circuit design;
  (c) calculating a first resistance solution and a single capacitance solution from the design database and the first set of operating conditions;
  (d) performing a parasitic extraction of the first resistance solution and the single capacitance solution to generate a first set of parasitic values;

(e) saving the single capacitance solution to calculate a second set of parasitic values from a second resistance solution calculated for the second set of operating conditions;

(f) calculating the second resistance solution from the design database and the second set of operating conditions;

(g) performing a parasitic extraction of the second resistance solution and the single capacitance solution to generate the second set of parasitic values; and (h) generating as output the first set of parasitic values and the second set of parasitic values.

5. The computer program product of claim 4 wherein the first set of operating conditions and the second set of operating conditions differ in temperature.

6. The computer program product of claim 4 wherein the single capacitance solution is saved for future analysis of the integrated circuit design under different operating conditions.

* * * * *